United States Patent
Gupta et al.

(10) Patent No.: US 11,894,848 B2
(45) Date of Patent: Feb. 6, 2024

(54) REGISTER CIRCUIT WITH DETECTION OF DATA EVENTS, AND METHOD FOR DETECTING DATA EVENTS IN A REGISTER CIRCUIT

(71) Applicant: MINIMA PROCESSOR OY, Oulu (FI)

(72) Inventors: Navneet Gupta, Oulu (FI); Lauri Koskinen, Helsinki (FI)

(73) Assignee: MINIMA PROCESSOR OY, Oulu (FI)

( * ) Notice: Subject to any disclaimer, the term of this patent is extended or adjusted under 35 U.S.C. 154(b) by 123 days.

(21) Appl. No.: 17/311,186

(22) PCT Filed: Dec. 5, 2018

(86) PCT No.: PCT/FI2018/050882
§ 371 (c)(1),
(2) Date: Jun. 4, 2021

(87) PCT Pub. No.: WO2020/115352
PCT Pub. Date: Jun. 11, 2020

(65) Prior Publication Data
US 2022/0034964 A1    Feb. 3, 2022

(51) Int. Cl.
*H03K 3/037* (2006.01)
*G01R 31/317* (2006.01)
*G01R 31/3177* (2006.01)

(52) U.S. Cl.
CPC ......... *H03K 3/037* (2013.01); *G01R 31/3177* (2013.01); *G01R 31/31725* (2013.01)

(58) Field of Classification Search
CPC ......... H03K 3/012; H03K 3/037–0375; H03K 3/3562; H03K 3/35625
See application file for complete search history.

(56) References Cited

U.S. PATENT DOCUMENTS 6,567,943 B1    5/2003    Barnhart et al.
9,223,327 B1    12/2015   Zhu et al.
(Continued)

FOREIGN PATENT DOCUMENTS

WO    WO-2018/193150 A1    10/2018

OTHER PUBLICATIONS

International Search Report for PCT/FI2018/050882 (ISA/FI) dated Aug. 23, 2019 (5 pages).
(Continued)

*Primary Examiner* — Patrick O Neill
(74) *Attorney, Agent, or Firm* — Alston & Bird LLP

(57) ABSTRACT

A monitor circuit (301) for monitoring changes in an input digital value of a register circuit comprises a data input (302) configured to receive a copy of the input digital value of said register circuit, and one or more triggering signal inputs (303) configured to receive one or more triggering signals. One or more triggering edges thereof define an allowable time limit before which a digital value must appear at a data input of said register circuit to become properly stored in said register circuit. The monitor circuit comprises a data event (DE) output (305), so that said monitor circuit is configured to produce a DE signal at said DE output (305) in response to a digital value at said data input (302) changing within a time window defined by said one or more triggering signals.

8 Claims, 5 Drawing Sheets

(56) References Cited

U.S. PATENT DOCUMENTS

| | | | |
|---|---|---|---|
| 11,558,039 B2* | 1/2023 | Gupta | G06F 1/12 |
| 2006/0220716 A1 | 10/2006 | Nicolaidis | |
| 2013/0002298 A1* | 1/2013 | Howard | H03K 3/0375 |
| | | | 327/144 |
| 2013/0003905 A1 | 1/2013 | Jain et al. | |
| 2013/0169360 A1 | 7/2013 | Gupta et al. | |
| 2014/0122947 A1 | 5/2014 | Bowman et al. | |
| 2018/0138900 A1 | 5/2018 | Das et al. | |
| 2018/0253521 A1 | 9/2018 | Shan et al. | |
| 2020/0389156 A1* | 12/2020 | Gupta | G06F 1/3206 |
| 2021/0318377 A1* | 10/2021 | Koskinen | G01R 31/30 |
| 2022/0027541 A1* | 1/2022 | Gupta | G06F 30/392 |

OTHER PUBLICATIONS

Written Opinion for PCT/FI2018/050882 (ISA/FI) dated Aug. 23, 2019 (7 pages).
Reyserhoven, H, *Efficient Design of Variation-Resilient Ultra-Low Energy Digital Processors*, KU Leuven—Faculty of Engineering Science, Sep. 2008.
Extended European Search Report for European Application No. 18942523.4 dated Jun. 20, 2022 (7 pages).

* cited by examiner

US 11,894,848 B2

REGISTER CIRCUIT WITH DETECTION OF DATA EVENTS, AND METHOD FOR DETECTING DATA EVENTS IN A REGISTER CIRCUIT

CROSS-REFERENCE TO RELATED APPLICATIONS

The present application is a national phase entry of International Application No. PCT/FI2018/050882, filed Dec. 5, 2018, the entire contents of which are incorporated herein by reference.

FIELD OF THE INVENTION

The invention is related to the technology of microelectronic circuits that comprise internal monitors for detecting timing events. In particular the invention concerns a way in which it can be ensured that the monitors are active and watching out for timing events even of none have been detected for a while.

BACKGROUND OF THE INVENTION

Time borrowing in a microelectronic circuit means that a circuit element is temporarily allowed to borrow time from a subsequent stage, i.e. change a digital value later than expected, if the subsequent circuit element(s) on the same processing path can handle it without corrupting the data that is being processed. Time borrowing may be combined for example with AVS (Advanced Voltage Scaling), so that the occurrence of time borrowing is detected as a timing event, and an increasing number of detected timing events causes an increase in the operating voltage and vice versa. The number of detected timing events may also trigger other compensating actions, typically involving changes in the values of other operating parameters of the circuit, like the clock frequency for example, or temporarily changing the clock waveform.

Processing paths in the microelectronic circuit go through logic units and register circuits, so that a register circuit stores the output value of a preceding logic unit at the rising or falling edge of a triggering signal (the register circuit is a flip-flop) or at a high or low level of the triggering signal (if the register circuit is a latch). A triggering edge or some other controlling event of the triggering signal defines an allowable time limit before which a digital value must appear at a data input of the register circuit to become properly stored. The allowable time limit is not necessarily the exact moment of the triggering edge, but defined in some relation to it due to physical effects such as the finite rate at which a voltage level can change.

Monitor circuits are used to detect timing events. A monitor circuit is a circuit element or functionality added to or associated with a register circuit and configured to produce a timing event observation (TEO) signal as a response to a change in the input digital value that took place later than said allowable time limit. In addition to the actual monitor circuits the microelectronic circuit must comprise an OR-tree and/or other structures for collecting, processing, and analyzing the TEO signals from the monitor circuits.

A major drawback of monitor circuits is that they consume circuit area and operating power. Placing monitor circuits into a designed microelectronic circuit involves compromises. The more monitor circuits, the better the coverage for detecting timing events, but simultaneously the more circuit area and operating power is consumed for other purposes than the one for which the microelectronic circuit was designed in the first place.

Knowledge about how circuit elements work allows the designer of a microelectronic circuit to make a delay distribution analysis that tells, how much delay each circuit element will cause to the data that proceeds through it. A straightforward guideline for placing monitor circuits would involve categorizing the circuit elements into delay classes according to how long delays they will cause, and placing monitors to only those register circuits that come after circuit elements of the longest delay class on the processing paths. However, that will provide only a partial solution to the problem, for a number of reasons.

First, individual variation between manufactured microelectronic circuits makes it uncertain, which circuit elements will actually be the critical ones. A circuit element that according to the delay distribution analysis belonged only the second or third longest delay class might actually be the most critical circuit element in a real-life manufactured circuit. Second, executed software might be such that—at least under certain circumstances—it does not use those processing paths that go through the most critical circuit elements for extended periods of time, so that the timing events that should be detected actually take place on those processing paths that were not deemed critical in the delay distribution analysis. Third, even if data is currently flowing through (also) the critical processing paths it may happen that for the moment that data contains extended sequences of constant (unchanging) digital values, which naturally makes the detection of timing events on those paths impossible because timing events can only occur when a digital value changes at the input of a register circuit.

Additional complexity to the task of designing a microelectronic circuit comes from the requirement of testability. The concept of DFT (Designed For Testability, or Design-For-Test) has become a de facto industrial standard that defines certain procedures for testing a microelectronic circuit. As an example, it should be possible to selectively couple the register circuits contained in the microelectronic circuit into long chains that operate essentially as shift registers: a string of digital values can be fed in from one end and read out from the other end. Passing a known test pattern through such a chain of register circuits and checking its form at the output tells whether all register circuits in the chain are changing their states as desired or whether there are register circuits that are stuck at some particular value (stuck-at fault test). An at-speed fault test involves feeding in a test pattern slowly at a low clock speed, then giving one or more clock pulses at the full operating speed so that the test pattern proceeds in the chain at functional logic speed by as many steps as there are clock pulses, and finally clocking the test pattern out again at a low clock speed. The at-speed test may give information about register circuits that are slower than intended. If there are monitor circuits and time borrowing capability involved, also these should be testable.

SUMMARY

An objective of the invention is to provide a monitor circuit, a register circuit, and an adaptive microelectronic circuit in which the problems of prior art described above are mitigated or eliminated. As a particular objective the monitor circuit, register circuit, and adaptive microelectronic circuit should enable obtaining reliable knowledge of the actual state of operation on dedicated processing paths. A further objective is that the monitor circuit, register circuit, and adaptive microelectronic circuit would conform to standard practices of DFT.

According to a first aspect there is provided a monitor circuit for monitoring changes in an input digital value of a register circuit. The monitor circuit comprises a data input configured to receive a copy of the input digital value of said register circuit, and one or more triggering signal inputs configured to receive one or more triggering signals. One or more triggering edges of the triggering signals define an allowable time limit before which a digital value must appear at a data input of said register circuit to become properly stored in said register circuit. The monitor circuit comprises a data event (DE) output, so that said monitor circuit is configured to produce a DE signal at said DE output in response to a digital value at said data input changing within a time window defined by said one or more triggering signals.

According to an embodiment the monitor circuit comprises a timing event observation (TEO) output, so that said monitor circuit is configured to produce a TEO signal at said TEO output in response to a digital value at said data input changing later than said allowable time limit. This involves the advantage that the monitor circuit can be used to detect timing events in addition to data events.

According to an embodiment said TEO and DE outputs share physically a common output, so that said monitor circuit is configured to produce both said TEO and DE signals at said common output. This involves the advantage that the output configuration of the monitor circuit is simple, and fewer output connections are required.

According to an embodiment the monitor circuit comprises a selection control input, so that whether said monitor circuit is configured to output TEO or DE signals or both through said common output depends on a selection control value received through said selection control input. This involves the advantage that a control unit of a microelectronic circuit has versatile possibilities of utilizing the various monitor circuits.

According to an embodiment the monitor circuit is configured to output, as a response to a first selection control value received through said selection control input, only TEO signals through said common output and, as a response to a second selection control value through said selection control input, only DE signals through said common output. This involves the advantage that the operative roles of the monitor circuits can be clearly distinguished, and the use of the monitor circuit can be clearly delimited for certain purposes.

According to an embodiment the monitor circuit is configured to output, as a response to a first selection control value received through said selection control input, only TEO signals through said common output and, as a response to a second selection control value through said selection control input, both TEO and DE signals through said common output. This involves the advantage that in the latter mode the monitor circuit can be used to detect all kinds of activity on the processing path.

According to an embodiment the monitor circuit comprises a detection control input, so that said monitor circuit is configured to selectively enable or disable the outputting of any of TEO or DE signals in response to control values received through said detection control input. This involves advantages for example in testing, where the monitor circuit can be controllably made to operate in an optimal way.

According to an embodiment the monitor circuit is an adaptive monitor circuit, the performance of which is configurable by making an operating parameter of the monitor circuit assume an operating parameter value. This involves the advantage that the monitor circuit can effectively contribute to power saving in an adaptive microelectronic circuit.

According to a second aspect there is provided a register circuit for temporarily storing a digital value in a microelectronic circuit. The register circuit may be configured to support time borrowing, and it may comprises or be associated with a monitor circuit of a kind described above.

According to various embodiments the register circuit may be a single-edge triggered flip-flop, a dual-edge triggered flip-flop, or a latch. The applicability of the operating principle to various implementations involves the advantage that the operating principle of the register circuit does not limit the choice of technology for a larger entity, like an adaptive microelectronic circuit.

According to a third aspect there is provided an adaptive microelectronic circuit that comprises a plurality of logic units and a plurality of register circuits arranged into one or more processing paths. At least one of said register circuits comprises a monitor circuit of the kind described above.

According to an embodiment at least one of said register circuits comprises a monitor circuit that comprises a timing event observation (TEO) output, so that said monitor circuit is configured to produce a TEO signal at said TEO output in response to a digital value at a data input changing later than an allowable time limit. Such an adaptive microelectronic circuit may comprise a control unit, configured to select values for operating parameters based on results of performance measurements obtained from parts of said microelectronic circuit, wherein one of said operating parameters is an operating voltage. Said control unit may be configured to lower an operating voltage value as a response to said results indicating a level of detected timing events that is below a first threshold. Said control unit may be configured to perform said lowering of said operating voltage value additionally as a response to said results indicating a level of detected data events that is above a second threshold. This involves the advantage that particularly accurate and educated decisions about the operating voltage can be made in the control unit.

According to an embodiment said control unit may be configured to activate a dedicated process for obtaining data events in order to obtain a result indicating a level of detected data events. This involves the advantage that there is a smaller probability that a decision about the operating voltage could be based on inaccurate grounds.

According to an embodiment said adaptive microelectronic circuit may be configured to selectively set a length of a detection window, so that said detection window comprises at least one of a data event detection window for detecting data events occurring before said allowable time limit and a timing event detection window for detecting timing events occurring after said allowable time limit. This involves the advantage that decisions about operating parameter values can be made in a particularly accurate way that takes into account not only the occurrence of events but also the way in which the events occur with respect to the allowable time limits and other features of the clock cycles in the microelectronic circuit.

According to an embodiment the adaptive microelectronic circuit is configured to set a first length of said detection window; obtain a first result indicating a first level of detected data events or timing events while using said first length of said detection window; set a second length of said detection window, different from said first length; obtain a second result indicating a second level of detected data events or timing events while using said second length of said detection window; and select a value for at least one operating parameter based on at least one of said first and second levels of detected data events or timing events. This involves the advantage that the decisions about operating parameter values can be based on comparing how events occur under two distinctly defined circumstances.

According to an embodiment the adaptive microelectronic circuit is configured to apply different thresholds of levels of detected data events depending on whether said data events were detected using said first length or said second length of said detection window, so that said value selected for said at least one operating parameter depends on whether the level of detected data events was above or below the threshold applied. This involves the advantage of additional flexibility and adaptivity in making the decisions about the operating parameter values.

According to an embodiment the adaptive microelectronic circuit comprises a plurality of signal-collecting circuits. A first signal-collecting circuit among said plurality of signal-collecting circuits is configured to collect DE and/or TEO signals from a first group of monitor circuits within the microelectronic circuit and to deliver the collected DE and/or TEO signals or indications thereof to said control unit. A second signal-collecting circuit among said plurality of signal-collecting circuits is configured to collect DE and/or TEO signals from a second group of monitor circuits within the microelectronic circuit, different from said first group, and to deliver the collected DE and/or TEO signals or indications thereof to said control unit. Said control unit is configured to perform said lowering of said operating voltage value based on what it received from said plurality of signal-collecting circuits. This involves the advantage that the control circuit is capable of taking into account where in the adaptive microelectronic circuits the events were detected.

According to an embodiment the adaptive microelectronic circuit comprises a non-delay-critical portion of the microelectronic circuit that comprises at least one of said monitor circuits and that does not comprise delay-critical processing paths. Said control unit is configured to selectively lower said operating voltage value to a low value for the duration of a period when processing of digital data takes place only within said non-delay-critical portion, which low value is lower than a minimum operating voltage value needed to make digital values appear at data inputs of register circuits on delay-critical processing paths of the microelectronic circuit before respective allowable time limits. This involves the advantage of additional saving of power compared to the case in which the lowest possible operating voltage value was only defined by the delay-critical processing paths.

According to an embodiment said non-delay-critical portion comprises a wake-up control circuit that comprises at least one of said monitor circuits. Said control unit is configured to selectively set the microelectronic circuit from an active mode into a sleep mode in which parts of the microelectronic circuit other than said wake-up control circuit are inactive. Said control unit is configured to set the microelectronic circuit from said sleep mode into said active mode in response to receiving a DE signal from said at least one of said monitor circuits comprised in said wake-up control circuit. This involves the advantage that the detection of data events can be applied to implement a wake-up control circuit.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
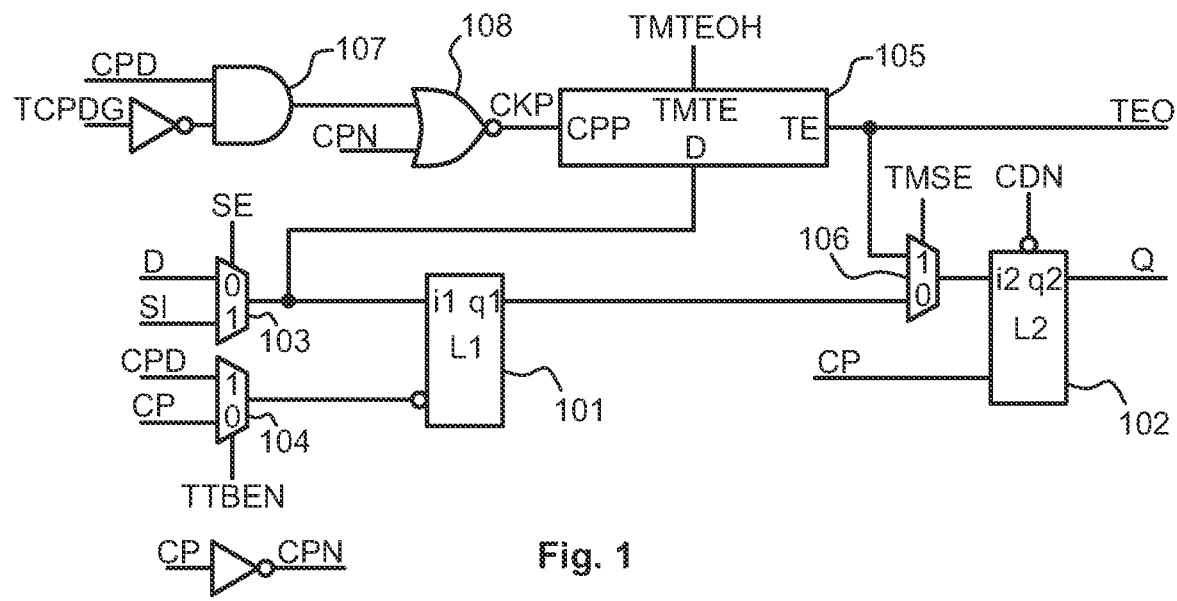
FIG. 1 illustrates a register circuit.

In the following, microelectronic circuits and methods for their designing and operating will be described. A typical microelectronic circuit comprises a plurality of logic units and register circuits, arranged into a plurality of processing paths. A processing path is a sequence of circuit elements through which digital data may pass, so that it gets processed in logic units and temporarily stored in register circuits that are located between consecutive logic units on said processing paths. The software that the micro-electronic circuit executes defines, which processing paths are used at any given time and in which way.

In order to provide better understanding to some of the details explained later, an example of a register circuit is described with reference to FIG. 1. The register circuit of FIG. 1 comprises a first subregister stage 101 and a second subregister stage 102. The data input and data output of the first sub-register stage 101 are marked as i1 and q1 respectively, and the data input and data output of the second subregister stage 102 are marked as i2 and q2 respectively. The data input D of the register circuit is coupled to the data input i1 of the first subregister stage 101 through a multiplexer 103, so that a high level of the control signal SE causes a test input SI to be coupled to the data input i1 of the first sub-register stage 101 instead. The data output q2 of the second subregister stage 102 is coupled to the data output Q of the register circuit.

The register circuit comprises two triggering signal inputs for the triggering signals CP and CPD. The first-mentioned can be called here the clock signal. For reasons explained in more detail below the other triggering signal CPD is a delayed version of the clock signal CP, preferably so that the delay is not more than one half cycle of CP, and can thus be called the delayed clock signal. Depending on the value (low/high) of the control signal TTBEN, either the delayed clock signal CPD or the clock signal CP is coupled to the triggering signal input of the first subregister stage 101. The clock signal CP is coupled to the triggering signal input of the second subregister stage 102.

The register circuit of FIG. 1 comprises, or is associated with, a monitor circuit 105 that is configured to produce a timing event observation (TEO) signal as a response to a change in a digital value at the data input D of the register circuit that took place later than an allowable time limit. The capability of producing TEO signals is not essential, but it can be combined with other features of the monitor circuit to produce some particularly advantageous embodiments. The time limit is defined by the clock signal CP and by the physical characteristics of the appropriate circuit elements. Simplified, the digital value at the data input D should just have assumed its appropriate value before a triggering edge in the clock signal CP, so that if a change that was supposed to come before the triggering edge comes after it, it is late. In practice there are factors like finite rising and falling times, which means that the allowable time limit is not exactly the moment of the triggering edge but typically slightly earlier. In some special cases it may be even slightly later.

The data input D of the monitor circuit 105 receives a copy of what goes into the data input i1 of the first subregister stage 101. The clock pulse input CPP of the monitor circuit 105 receives a triggering signal that defines the allowable time limit after which a change in the digital value at the data input of the register circuit is late. The triggering signal received at the clock pulse input CPP may define the so-called TEO window, so that it defines also an end limit, after which the monitor circuit 105 does not react any more to a change in the input data.

At its timing event output TE the monitor circuit 105 is configured to produce the TEO signal. Here we may assume a signal level convention according to which the TEO signal is normally low, but goes high at the moment of observing a timing event and remains high until the end of the clock cycle during which the timing event was observed. With a suitable value of the control signal TMTEOH the monitor circuit 105 may be made to maintain the high value, once occurred, of the TEO signal longer than just until the end of the clock cycle. This function is useful for example in test mode, in which a maintained high value of the TEO signal may be collected for further processing and analysis.

The use of a delayed clock signal CPD as the triggering signal of the first subregister stage 101 makes the register circuit capable of time borrowing. In other words, a logic unit or other part of processing path that precedes this kind of a register circuit is temporarily allowed to cause a timing event, i.e. a late change of a digital value, because the register circuit of FIG. 1 can handle it without corrupting the data that is being processed. As long as the late-arriving change of digital value at the data input D comes before the triggering edge in the delayed clock signal CPD, it will get correctly stored in the register circuit. (To be quite exact, there are rising and falling times involved also here, so the ultimate limit is some allowable time limit defined by the delayed clock signal CPD, not necessarily the exact moment of the triggering edge thereof.) Time borrowing can be disabled by making the value of the control signal TTBEN low, in which case the clock signal CP is used as the triggering signal of the first sub-register stage 101.

The data input i2 of the second subregister stage 102 receives either the value at the data output q1 of the first subregister stage 101 or the value at the TE output of the monitor circuit 105, depending on the value of the control signal TMSE that controls the multiplexer 106. Here it is assumed that the microelectronic circuit comprises a so-called common scan chain that is used to collect the digital values that the tested circuit elements produce during test mode. A high value of the control signal TMSE causes the output value of the monitor circuit 105 to be directed to the common scan chain, while a low value of TMSE directs the actual, temporarily stored digital value that went to the first and second subregister stages to the common scan chain. The control signal CDN to the second subregister circuit 102 is an asynchronous reset signal.

Figure 2:
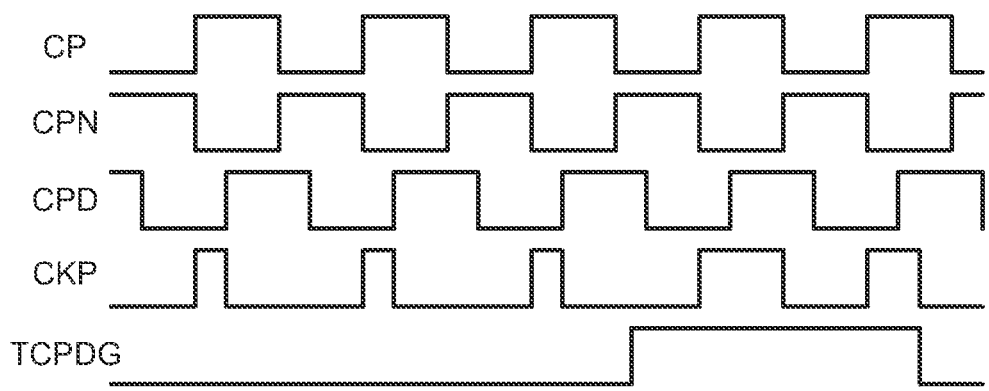
FIG. 2 illustrates waveforms of signals in the register circuit of FIG. 1.

FIG. 1 illustrates one possible way of producing the triggering signal CKP that goes into the clock pulse input CPP of the monitor circuit. The associated waveforms are shown in FIG. 2. Normally the signal TCPDG is low and its inverse thus high, so the delayed clock signal CPD goes as such through the AND gate 107 to one input of the NOR gate 108. The other input of the NOR gate receives an inverse CPN of the clock signal CP. The triggering signal CKP that goes into the triggering input CPP of the monitor circuit 105 is high for the duration between rising edges in the clock and delayed clock signals CP and CPD. When the signal TCPDG goes high, its inverse goes low, and the output of the AND gate 107 remains low. This makes the triggering signal CKP an inverse of the inverted clock signal CPN, i.e. equal to the clock signal CP.

The exact way in which the monitor circuit 105 is implemented internally is of lesser importance, as long as it is capable of performing the functions described in this text. Examples of physical implementations of monitor circuits are found for example in the patent application number PCT/FI2017/050290.

It is not advisable to equip each and every register circuit of a microelectronic circuit with a monitor circuit, because the monitor circuits consume circuit area and operating power within the microelectronic circuit. Monitor circuits are of best use when placed after those logic units that are most likely to cause the longest delays. These can be found with proper analyzing tools during designing the microelectronic circuit. The TEO signals from the monitor circuits can be used for example for AVS (Advance Voltage Scaling), for example so that if the number of detected timing events per unit time gets higher than an allowable limit, operating voltage is increased.

However, such a control strategy might not work appropriately if the lack (or low number) of TEO signals from a processing path is caused by the small number of data events in that processing path, rather than by the logic units working sufficiently fast. A data event is an intentional change of a digital value. If a processing path is currently not getting any digital data to process, or if for some reason the digital data that goes through a monitor-equipped register circuit in that processing path consists of a very long sequence of a constant, unchanging value, there will be no TEO signals even if one or more logic units in that processing path are already working unallowably slow. This might lead to a situation in which the operating voltage is lowered so much that excessive delays begin to occur even on such processing paths that were not considered critical in designing the microelectronic circuit and were consequently not equipped with monitors in their register circuits. Also, the next change of digital data on the critical processing path will practically certainly cause a timing event in such a case.

For these reasons it is advantageous if a monitor circuit in (or associated with) a register circuit is capable of producing DE (data event) signals, which are provided in response to a digital value at the data input of the register circuit changing in the first place. The possible change is examined within a time window that is defined by one or more triggering signals that the register circuit receives. Examples of such triggering signals and time windows are described in more detail later in this text. Another advantageous thing to have would be the capability of differentiating between a situation with no data events and a situation with no timing events while having data events. Additionally the register circuit may comprise a timing event observation (TEO) output, so that said monitor circuit is configured to produce a TEO signal at said TEO output in response to a digital value at said data input changing later than said allowable time limit, but this is not a necessity.

For the purpose of avoiding unnecessary state changes and the resulting consumption of power in the microelectronic circuit, it is advantageous if the generation of DE signals, i.e. the intentional detection of data events, can be switched on and off in the register circuit by making a corresponding control signal assume predefined values. According to an embodiment the monitor circuit may be configured to produce either TEO signals or DE signals as mutually exclusive alternatives, or it may be configured to produce both TEO and DE signals. Here it must be noted that a timing event is always also a data event, so a produced TEO signal is always simultaneously a DE signal. Thus producing TEO and DE signals as mutually exclusive alternatives means that the monitor circuit operates either in a mode in which it produces a DE signal if the data value changes in time but does not react to late changes, or in a mode in which it produces a TEO signal if the data value changes late but does not react to timely changes.

Figure 3:
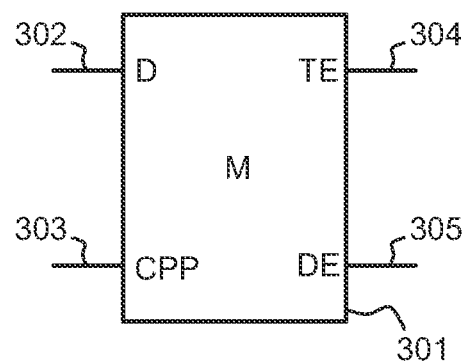
FIG. 3 illustrates a monitor circuit.

FIG. 3 illustrates a monitor circuit 301 that can be associated with, or combined into an integrated structure with, a register circuit. The register circuit is not shown in FIG. 3. The monitor circuit 301 is for monitoring changes in an input digital value of the register circuit, and comprises a data input 302 configured to receive a copy of the input digital value of the register circuit. The register circuit 301 may comprise one or more triggering signal inputs that are configured to receive one or more triggering signals. One or more triggering edges of said one or more triggering signals define an allowable time limit before which a digital value must appear at a data input of the register circuit to become properly stored in the register circuit. In the particular case shown in FIG. 3 the register circuit 301 comprises one triggering signal input 303, marked as CPP for a Clock Pulse Port. A reference to "one triggering edge" in a triggering signal means one type of an edge that occurs regularly, like the rising edge of every clock pulse. A reference to "more triggering edges" refer to two or more such edges, like the rising and falling edges of every clock pulse and/or the rising edges of pulses in two different triggering signals.

The monitor circuit 301 comprises a timing event observation (TEO) output 304, marked as TE for Timing Event. The monitor circuit 301 is configured to produce a TEO signal at the TEO output 304 in response to a digital value at the data input of the register circuit changing later than said allowable time limit. Additionally the monitor circuit 301 comprises a data event (DE) output 305. The monitor circuit 301 is configured to produce a DE signal at the DE output 305 in response to a digital value at said data input of the register circuit changing within a time window defined by the one or more triggering signals.

Figure 4:
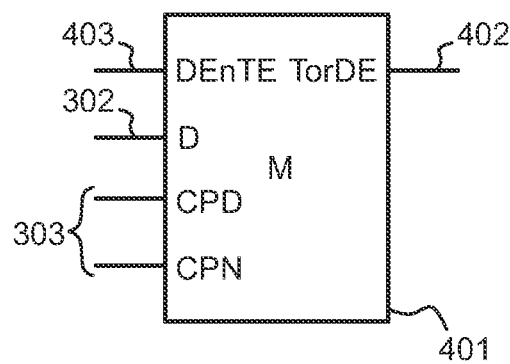
FIG. 4 illustrates a monitor circuit.

FIG. 4 illustrates another example of a monitor circuit 401 for monitoring changes in an input digital value of a register circuit (which register circuit is not shown in FIG. 4). Also the monitor circuit 401 comprises a data input 302 that is configured to receive a copy of the input digital value of the register circuit, and two triggering signal inputs 303, marked as CPD for a Clock Pulse Delayed and CPN for Clock Pulse Negative, for the same purpose as described above with reference to FIG. 3. The monitor circuit 401 is configured to produce a TEO signal in response to a digital value at the data input of the register circuit changing later than an allowable time limit. Additionally the monitor circuit 401 is configured to produce a DE signal in response to a digital value at said data input of the register circuit changing within a time window defined by one or more triggering signals.

In the monitor circuit 401 of FIG. 4 the TEO and DE outputs share physically a common output 402. In this case the monitor circuit 401 is configured to produce both said TEO and DE signals at said common output 402. The monitor circuit 401 comprises a selection control input 403, so that whether the monitor circuit 401 is configured to output TEO or DE signals or both through the common output 402 depends on a selection control value that it received through the selection control input 403.

The name DEnTE given to the selection control input 403 in FIG. 4 suggests that the monitor circuit 401 is configured to output either TEO signals or DE signals as mutually exclusive alternatives: "Data Event, not Timing Event". The name TorDE given to the common output 402 suggests that the a signal produced at the common output 402 may indicate the detection of either a timing event or a data event ("Timing or Data Event") depending on the selection control value that the monitor circuit received through the selection control input 403.

Figure 5:
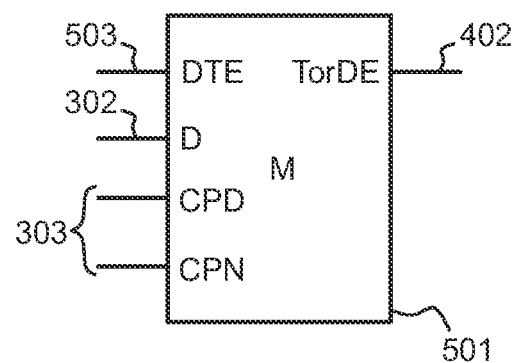
FIG. 5 illustrates a monitor circuit.

FIG. 5 illustrates another example of a monitor circuit 501 for monitoring changes in an input digital value of a register circuit (which register circuit is not shown in FIG. 5). The roles of a data input 302, two triggering signal inputs 303, and a common output 402 are the same as in FIG. 4. The monitor circuit 501 comprises a selection control input 503, so that whether the monitor circuit 501 is configured to output TEO or DE signals or both through the common output 402 depends on a selection control value that it received through the selection control input 503.

The name DTE given to the selection control input 503 in FIG. 5 suggests that the monitor circuit is configured to output either only TEO signals (when DTE is low) or both TEO and DE signals (when DTE is high): "Data or Timing Event".

Figure 6:
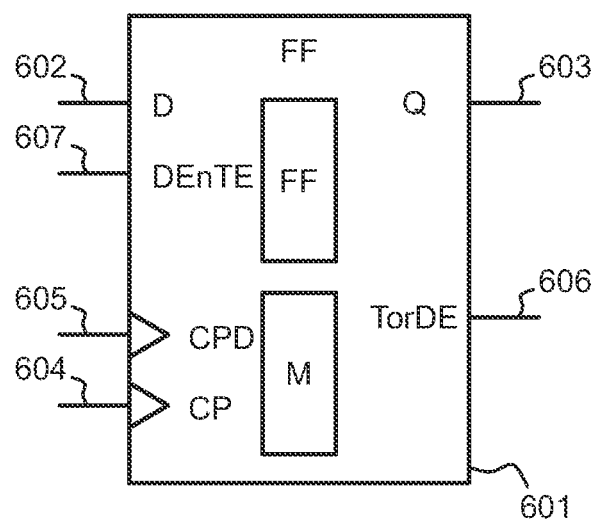
FIG. 6 illustrates a register circuit comprising a monitor circuit.

FIG. 6 illustrates a register circuit 601, here of the flip-flop (FF) type, for temporarily storing a digital value in a microelectronic circuit. A register circuit of this kind would typically appear as a part of a processing path, in which its data input 602 is coupled to receive an input digital value from a preceding logic unit and its data output 603 is coupled to deliver an output digital value to a subsequent logic unit.

The register circuit 601 of FIG. 6 is shown to comprise the actual storage part used for temporarily storing the digital value, as the block "FF", as well as the monitor circuit for monitoring changes in an input digital value of the register circuit, as the block "M". The register circuit 601 comprises two triggering signal inputs 604 and 605 for receiving two triggering signals. One or more triggering edges of such triggering signals define an allowable time limit before which (or an allowable time window within which) a digital value must appear at the data input 602 to become properly stored in the register circuit 601. The triggering signal inputs 604 and 605 are named as CP and CPD for a clock pulse and a delayed clock pulse respectively. Depending on how the triggering signals control the temporary storing of digital values in the register circuit 601 it may be for example a single-edge triggered flip-flop, a dual-edge triggered flip-flop, or a latch.

Figure 7:
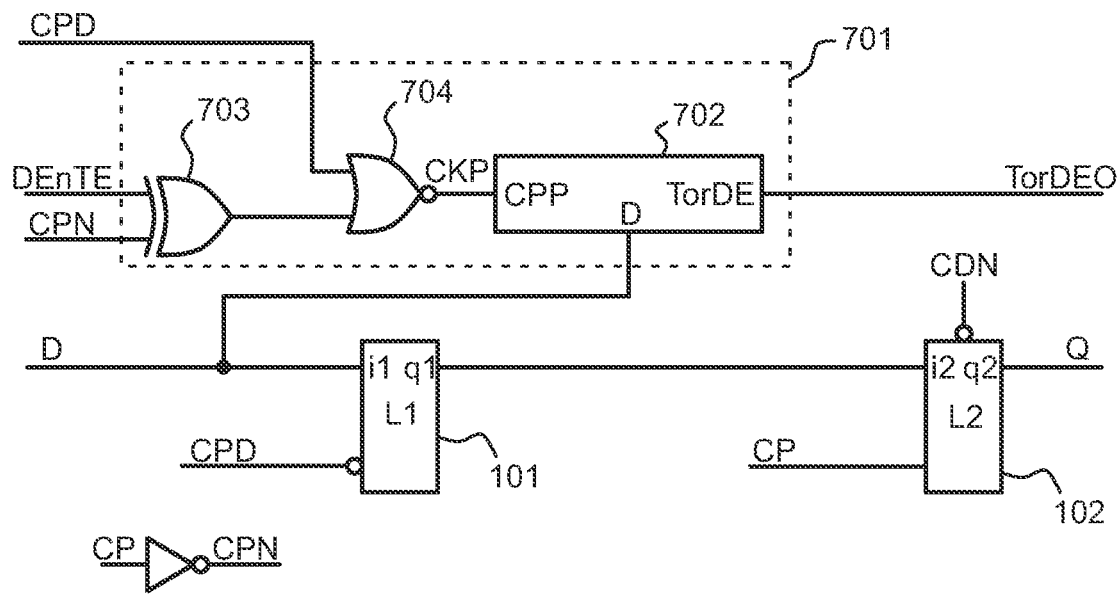
FIG. 7 illustrates a register circuit.

The register circuit 601 of FIG. 6 comprises a common output 606 through which the monitor circuit therein is configured to produce both TEO and DE signals. FIG. 7 shows an example of how a register circuit of the kind shown in FIG. 6 could be implemented in practice. For temporarily storing the digital value it comprises two subregister stages 101 and 102 coupled in series and clocked with the CP and CPD signals essentially in the same way as was explained earlier with reference to FIG. 1. The register circuit of FIG. 7 could comprise the parts 103, 104, and 106 like in FIG. 1, as well as the inputs for the control signals SE, TTBEN, TMTEOH, and TMSE, but these have been omitted in FIG. 7 for graphical simplicity. The register circuit of FIG. 7 supports time borrowing, which is manifested by the delayed clock signal CPD clocking the first subregister stage 101. The monitor circuit is shown with the reference designator 701, which here covers both the functional block 702 corresponding to that called a monitor circuit in FIG. 1 and the logical gates 703 and 704 used to form the clocking pulses (the CKP signal) for it.

The selection control value received through the selection control input DEnTE and the inverse CPN of the clock signal are taken as inputs to the XOR gate 703. Its output and the delayed clock signal CPD are taken as inputs to the NOR gate 704, the output of which is used as the CKP signal. As a result when DEnTE is low, the CKP signal has a high pulse between each rising edge in the CP signal and the immediately following rising edge in the CPD signal. This high pulse defines the timing event detection window. When DEnTE is high, the CKP signal has a high pulse between each falling edge in the CPD signal and the immediately following rising edge in the CP signal. This high pulse defines the data event detection window.

The register circuit of FIG. 7 is of the type in which the monitor circuit 701 is configured to output either TEO signals or DE signals as mutually exclusive alternatives, so that a low value at the selection control input DEnTE makes it output exclusively TEO signals and a high value at the selection control input DEnTE makes it output exclusively DE signals. The corresponding waveforms are shown in FIG. 8, together with an example of a data input (D) waveform.

Figure 8:
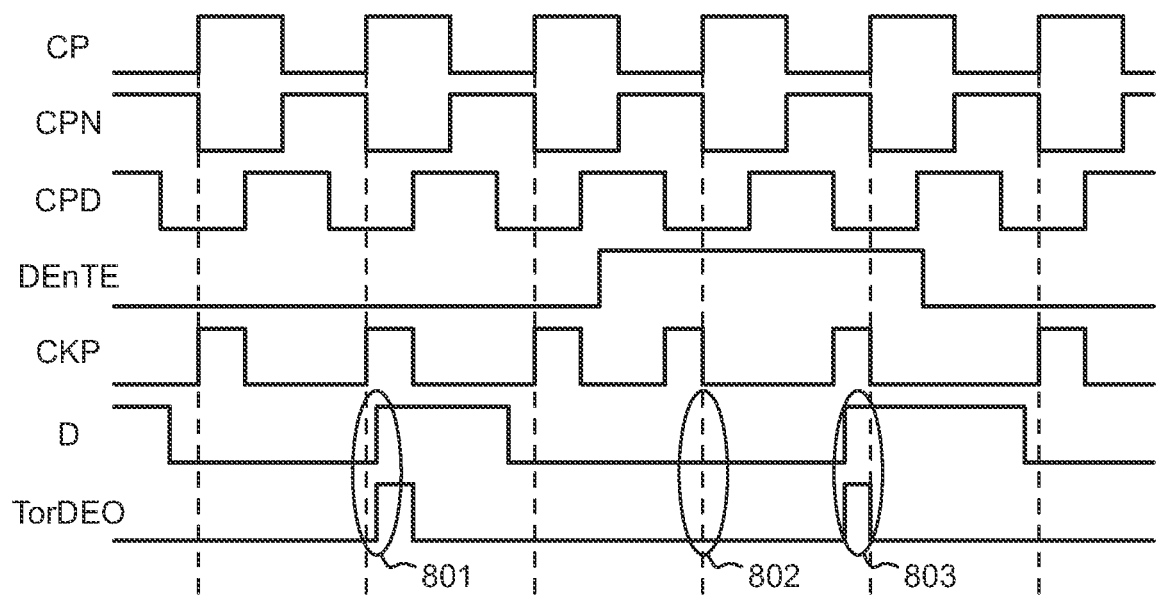
FIG. 8 illustrates waveforms of signals in the register circuit of FIG. 7.

In the beginning of the case shown in FIG. 8 the selection control signal DEnTE is low, so only TEO signals are produced. At point 801 the digital value at the data input D changes late, so a TEO signal is produced by making the common output TorDEO go high until the next falling edge of the clock pulse signal CKP. At a certain moment the selection control signal DEnTE goes high, after which only DE signals are produced. At point 802 there is no change in the digital value at the data input D, so no DE signal is produced. At point 803 there is a (timely) change in the digital value at the data input D, so a DE signal is produced by making the common output TorDEO go high until the next falling edge of the clock pulse signal CKP.

The register circuit of FIG. 7 does not output anything in the case where the selection control signal DEnTE is high and the digital value at the data input D changes late. In other words, producing DE signals excludes producing TEO signals in the register circuit of FIG. 7. More formally this may be described so that the monitor circuit 701 is configured to output, as a response to a first selection control value received through the selection control input DEnTE, only TEO signals through the common output TorDEO and, as a response to a second selection control value through said selection control input, only DE signals through said common output. In some cases this may be undesirable, as the register circuit might be required to detect timing events and produce TEO signals also when the selection control signal DEnTE is high to mark the need to detect data events.

Depending on the length in time of the detection window and on the time at which the digital data changes at the input of the register circuit, the pulse in the TEO signal (when DEnTE is low) or the pulse in the DE signal (when DEnTE is high) may become rather short. For example at the moment 803 in FIG. 8, if the change in the data signal D came very close to the vertical dashed line that marks the separation between consecutive clock cycles (but still on the left side of said dashed line), the pulse in the TorDEO waveform would become very short. In order to ensure that such pulses are nevertheless correctly detected there could be a pulse detector coupled to the common output TorDEO of the monitor circuit 701. Such a pulse detector could be configured to always maintain a high value long enough to be detected by some subsequent circuit element. It is advisable though to reset any detection-indicating output in good time before the next monitored change in input digital data is to take place. If a pulse detector is not in use, the monitor circuit 701 may be internally configured so that it always resets the common output TorDEO at the next falling edge of the clock pulse signal CP.

Figure 9:
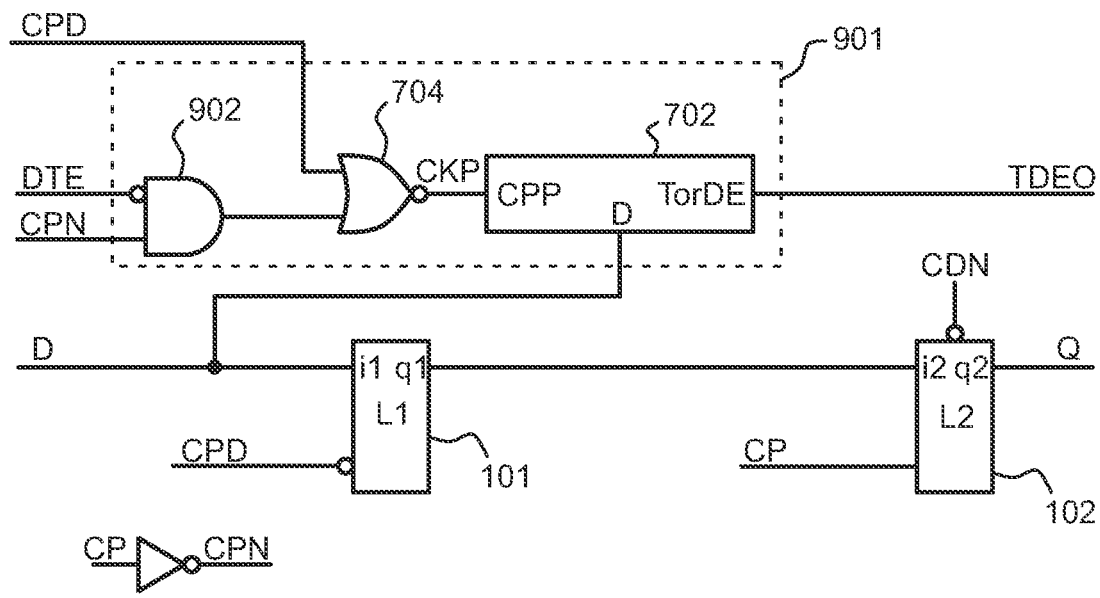
FIG. 9 illustrates a register circuit.

FIG. 9 illustrates another example of a register circuit. The difference compared to the register circuit of FIG. 7 is in the way in which the clocking signal CKP is formed. In FIG. 9 the selection control signal DTE and the inverted clock signal CPN go as inputs to an AND gate 902, with the selection control signal DTE inverted in order to maintain the same polarity as with the DEnTE signal of FIG. 7 (low=only timing events to be detected). The output of the AND gate 902 and the delayed clock signal CPD go as inputs to the NOR gate 704.

Figure 10:
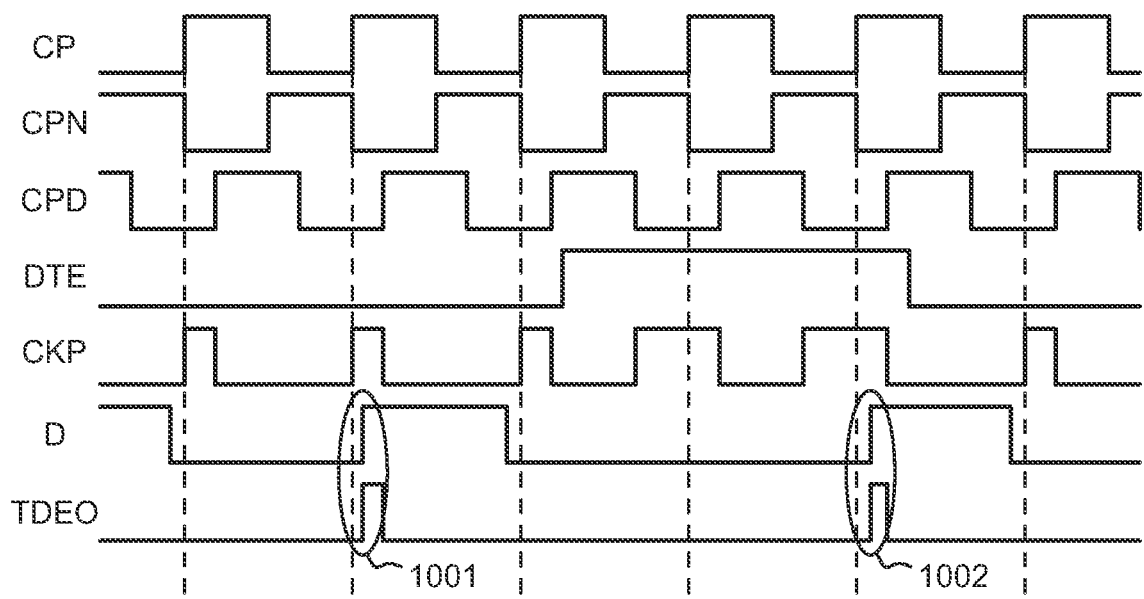
FIG. 10 illustrates waveforms of signals in the register circuit of FIG. 9.

As shown in FIG. 10, when the selection control signal DTE is low, the CKP signal has again a high pulse between each rising edge in the clock signal CP and the immediately following rising edge in the delayed clock signal CPD, defining the timing event detection window. A timing event occurs at point 1001 and a corresponding TEO signal is given by keeping the common output TDEO high until the next falling edge in the clock pulse signal CKP. When the selection control signal DTE is high, the CKP signal is essentially an inverse of the delayed clock signal CPD: it has a high pulse between each falling edge and the immediately following rising edge in the CPD signal. Thus the detection window for the monitor circuit, during which the monitor circuit detects changes in the input digital value of the register circuit, extends to both sides of the corresponding rising edge in the clock signal CP. A data event occurs late at point 1002, and a corresponding TEO signal/DE signal is given by again keeping the common output TDEO high until the next falling edge in the clock pulse signal CKP.

Thus in the register circuit of FIG. 9 the monitor circuit 901 is configured to output, as a response to a first selection control value received through the selection control input DTE, only TEO signals through the common output TDEO and, as a response to a second selection control value through said selection control input, both TEO and DE signals through said common output.

Irrespective of which of the approaches of FIG. 7 or 9 is taken, it may be noted that when data events are to be detected (i.e. when DEnTE or DTE is high), the beginning of the detection window (i.e. the rising edge of the CKP pulse) defines, how "critical" the data events are that will be detected. Here the criticality of a data event is defined as its closeness to the rising edge of the clock signal CP. A data event very close to the rising edge of the clock signal CP is more critical, because even a small additional increase in delay might turn it into a timing event. More accurately, criticality can be defined as the closeness to the allowable time limit before which a digital value must appear at a data input of said register circuit to become properly stored in said register circuit.

If the microelectronic circuit is configured to selectively set the beginning of the detection window in relation to said allowable time limit, it may utilize register circuits capable of detecting data events to generate a kind of preparatory warnings about an immediate threat of delays becoming too long in some processing paths. More generally, the microelectronic circuit may be configured to selectively set a length of a detection window, so that the detection window may comprise a data event detection window for detecting data events occurring before said allowable time limit and/or a timing event detection window for detecting timing events occurring after said allowable time limit.

A microelectronic circuit that has the above-mentioned capability may use multiple event window sizes with different data event thresholds before deciding about voltage scaling. For example, the micro-electronic circuit may be configured to first set a first length of a detection window, and use that first length of the detection window to obtain a first result indicating a first level of detected data events or timing events. Then the microelectronic circuit may set a second length of said detection window, different from said first length, and obtain a second result indicating a second level of detected data events or timing events while using said second length of said detection window. The microelectronic circuit may then select an operating voltage level and/or a value of at least one other operating parameter based on at least one of said first and second levels of detected data events or timing events.

This principle may be modified and applied in many ways. For example, there may be first detected a first, not very critical level of timing events using a first length of a timing event detection window. Thereafter it may be found, using some other length of the timing event detection window, that although the timing events are rather rare, they come alarmingly late after the allowable time limit; in other words, those delays in processing that do occur are alarmingly long. As a result the operating voltage may be increased even if the absolute number of detected timing events per unit time is not that large.

Another example is to perform data event detecting within a data event detection window that becomes progressively shorter, close to the allowable time limit. If the number of detected timing events remains high despite the shortening timing event detection window, this means that a relatively large proportion of the detected data events take place alarmingly close to the limit of becoming timing events, which could again constitute a reason for increasing the operating voltage, lowering the operating frequency, or taking some other corrective action. These examples can obviously be inverted, for example so that detecting a strong decrease in data events when progressively shortening the data event detection window could constitute a reason for lowering the operating voltage, and so on.

Examples like those above, as well as other corresponding ways of utilizing detection windows of different lengths can be generally characterized as follows. The adaptive microelectronic circuit may be configured to apply different thresholds of levels of detected data events depending on whether said data events were detected using a first length or a second length of said detection window. The value to be selected for at least one operating parameter will depend on whether the level of detected data events was above or below the particular threshold applied.

In some other cases, like in some cases of testing for example, it may be advantageous if the generation of (TEO and) DE signals can be disabled altogether. To this end any monitor circuit of the kind described here may comprise detection control input, so that said monitor circuit is configured to selectively enable or disable the outputting of any of TEO or DE signals in response to control values received through said detection control input.

The monitor circuit may itself also be adaptive. An adaptive monitor circuit is one the performance of which is configurable by making an operating parameter of the monitor circuit assume an operating parameter value. Such an operating parameter may be for example the operating voltage, or the frequency or pulse length of any of the triggering signals. As such, a circuit element does not need to be adaptive in order to be included in an adaptive system or microelectronic circuit.

Figure 11:
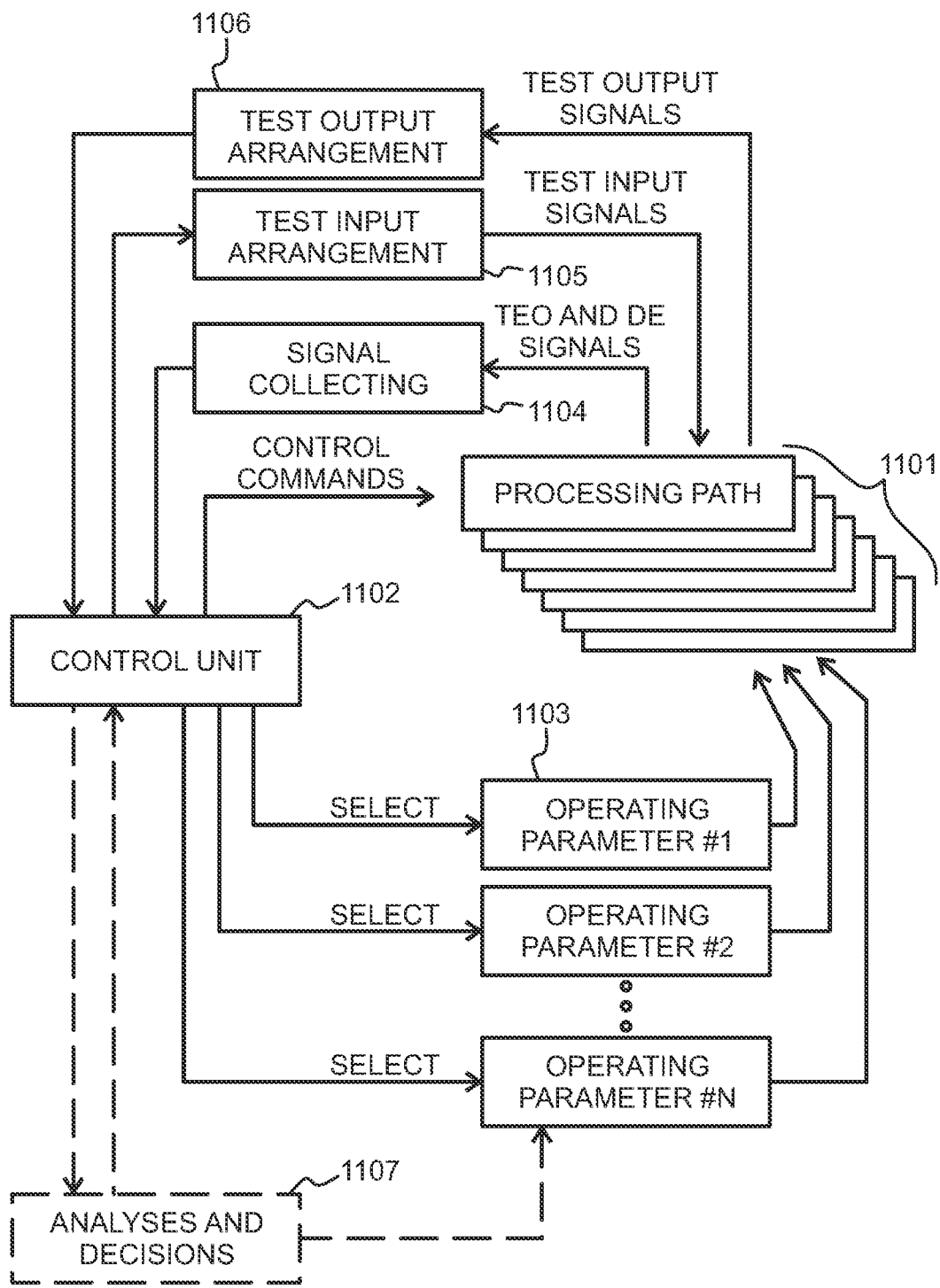
FIG. 11 illustrates a microelectronic circuit.

FIG. 11 illustrates an example of a microelectronic circuit that is both adaptive and DFT, and utilizes the technology of monitor circuits and register circuits explained earlier in this text. The microelectronic circuit comprises a plurality of logic units and a plurality of register circuits arranged into one or more processing paths 1101. At least one of the register circuits comprises a monitor circuit of the kind described above.

The adaptive microelectronic circuit of FIG. 11 comprises a control unit 1102 that is configured to select values for operating parameters based on results of performance measurements that it obtained from parts of the microelectronic circuit. Said results of performance measurements may for example indicate the number of detected timing events and/or data events per unit time, collected through one or more signal-collecting circuits 1104. One of said operating parameters may be an operating voltage. In FIG. 11 the microelectronic circuit comprises—and/or has at its disposal—a number of operating parameter blocks, so that for example the first operating parameter block 1103 may be responsible for generating the actual operating voltage at the level selected by the control unit 1102.

The control unit 1102 may be configured to lower an operating voltage value as a response to the results mentioned above indicating a level of detected timing events that is below a first threshold. In order to avoid situations where the low number of detected timing events was due to low or nonexistent activity in a processing path, the control unit 1102 may be configured to perform said lowering of said operating voltage value additionally as a response to said results indicating a level of detected data events that is above a second threshold.

The control unit 1102 may be configured to activate a dedicated process for obtaining data events in order to obtain a result indicating a level of detected data events. For this purpose the control unit 1102 has the ability to give control commands to circuit elements in the processing paths 1101. These control commands may comprise for example values of selection control signals of the DEnTE and/or DTE type, as explained above.

What is said about the capability and operation of the control unit 1102 above may be distributed to two or more physical and/or functional units. FIG. 11 illustrates schematically an analyses and decisions unit 1107 in which the results mentioned above are analyzed and in which decisions are taken about the values of operating parameters to be selected. The analyses and decisions unit 1107 may be configured to provide the control unit 1102 with information concerning the selected values of the operating parameters, so that using that information the control unit 1102 will actually effect the taking into use of the decided values. Additionally or alternatively there may be direct connections from the analyses and decisions unit 1107 to one or more of the operating parameter blocks 1103 so that the decided values of the operating parameters can be taken into use through direct action of the analyses and decisions unit 1107. The provision of a separate analyses and decisions unit 1107 may be conceptual, and any of the functionalities of the control unit 1102 and/or the analyses and decisions unit 1107 may be actually implemented either in hardware or in software or a combination of both.

The task of collecting TEO and/or DE signals is indicated as a single block 1104 in FIG. 11. In a more versatile embodiment the microelectronic circuit may comprise a plurality (i.e. two or more) of signal-collecting circuits 1104. These may be specific to monitor circuits, or groups of monitor circuits, so that the control unit 1102 may be configured to tailor its response based on what it received and from which signal-collecting circuit. This allows the control unit 1102 to make educated decisions about the operating parameter values depending what happens in which parts of the microelectronic circuits.

A first signal-collecting circuit among said plurality of signal-collecting circuits may be configured to collect DE and/or TEO signals from a first group of monitor circuits within the microelectronic circuit. The collected DE and/or TEO signals (or indications thereof) are then delivered to the control unit 1102. A second signal-collecting circuit among said plurality of signal-collecting circuits may be configured to collect DE and/or TEO signals from a second group of monitor circuits within the microelectronic circuit. The second group is different from said first group. The collected DE and/or TEO signals or indications thereof from the second group are similarly delivered to the control unit 1102. The control unit 1102 may be configured to perform the lowering of operating voltage value (and/or other changing of operating parameter values) based on what it received from which of the plurality of signal-collecting circuits.

The DFT capability of the microelectronic circuit of FIG. 11 is seen as the provision of a test input arrangement 1105 and a test output arrangement 1106. The test input arrangement 1105 makes it possible to selectively feed in test signals to the circuit elements of the processing paths 1101, and the test output arrangement 1106 enables selectively collecting test output signals from the circuit elements of the processing paths 1101. An example of using test input signals and test output signals, and the associated control commands that the control unit 1102 may use to selectively set the circuit elements in the processing paths 1101 into test mode, has been explained earlier in this text with reference to FIG. 1.

An interesting embodiment concerns the use of the detection of data events for producing wake-up calls for a microelectronic circuit that is in sleep mode. A sleep mode of a microelectronic circuit differs from an active mode in that in sleep mode extensive parts of the microelectronic circuit are inactive because there is no data to be processed in them. According to an embodiment, the microelectronic circuit may comprise a wake-up circuit that comprises a processing path with at least one register circuit, and a monitor circuit associated with said register circuit. The control circuit may be configured to selectively set the microelectronic circuit from an active mode into a sleep mode in which parts of the microelectronic circuit other than said wake-up control circuit are inactive. The control unit may further be configured to set the microelectronic circuit from said sleep mode into said active mode in response to receiving a DE signal from said at least one of said monitor circuits comprised in said wake-up control circuit.

The wake-up circuit may be constructed so that it does not comprise any delay-critical processing paths. In other words, it can be ascertained, by using suitably simple logic units not susceptible for causing long delays in the wake-up circuit, that changes in digital data that is being processed in the wake-up circuit will arrive in the input(s) of the respective, monitor-equipped register circuit(s) within the allowable time limit even if the operating voltage was below a delay-critical minimum value. The last-mentioned is defined as the minimum operating voltage value needed to make digital values appear at data inputs of register circuits on delay-critical processing paths of the microelectronic circuit before respective allowable time limits.

Since there is nothing delay-critical in the wake-up circuit, the control unit may lower the operating voltage value of the microelectronic circuit even below said delay-critical minimum value for the duration of the sleep mode. The operating voltage can be reduced down to a value at which timing events begin to occur even in one or more processing paths of the wake-up circuit. Lowering the operating voltage helps saving even more power than what the use of the sleep mode would otherwise make possible. The absence of delay-critical processing paths from the wake-up circuit means that the data event detection there will still work reliably, and provide the wake-up call to the control unit when needed.

As such, the principle of lowering the operating voltage below a delay-critical minimum value may be applied in any adaptive microelectronic circuit if a situation occurs in which it can be ascertained that processing of digital data will take place only on processing paths that are not delay-critical. Thus the principle explained above may be generalized so that an adaptive microelectronic circuit may comprise a non-delay-critical portion that comprises at least one of the monitor circuits and that does not comprise delay-critical processing paths. The control unit may be configured to selectively lower the operating voltage value to a low value for the duration of a period when processing of digital data takes place only within said non-delay-critical portion. The low value mentioned here is lower than a minimum operating voltage value needed to make digital values appear at data inputs of register circuits on delay-critical processing paths of the microelectronic circuit before respective allowable time limits.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. An adaptive microelectronic circuit, comprising a plurality of logic units and a plurality of register circuits arranged into one or more processing paths, wherein:
   at least one of said register circuits comprises a monitor circuit,
   the monitor circuit comprises a data input configured to receive a copy of the input digital value of said register circuit,
   the monitor circuit comprises one or more triggering signal inputs configured to receive one or more triggering signals, one or more triggering edges of which define an allowable time limit before which a digital value must appear at a data input of said register circuit to become properly stored in said register circuit, the monitor circuit comprises a data event output, referred to below as DE output, the monitor circuit is configured to produce a data event signal, referred to below as DE signal, at said DE output in response to a digital value at said data input changing within a time window defined by said one or more triggering signals, the monitor circuit comprised in said at least one of said register circuits comprises a timing event observation output, referred to below as TEO output, said monitor circuit is configured to produce a timing event observation signal, referred to below as TEO signal, at said TEO output in response to a digital value at said data input changing later than said allowable time limit, the adaptive microelectronic circuit comprises a control unit, configured to select values for operating parameters based on results of performance measurements obtained from parts of said microelectronic circuit, wherein one of said operating parameters is an operating voltage, said control unit is configured to lower an operating voltage value as a response to said results indicating a level of detected timing events that is below a first threshold, and said control unit is configured to perform said lowering of said operating voltage value additionally as a response to said results indicating a level of detected data events that is above a second threshold.

2. An adaptive microelectronic circuit according to claim 1, wherein said control unit is configured to activate a dedicated process for obtaining data events in order to obtain a result indicating a level of detected data events.

3. An adaptive microelectronic circuit according to claim 1, wherein said adaptive microelectronic circuit is configured to selectively set a length of a detection window, wherein said detection window comprises at least one of:
a data event detection window for detecting data events occurring before said allowable time limit and
a timing event detection window for detecting timing events occurring after said allowable time limit.

4. An adaptive microelectronic circuit according to claim 3, wherein said adaptive microelectronic circuit is configured to:
set a first length of said detection window,
obtain a first result indicating a first level of detected data events or timing events while using said first length of said detection window,
set a second length of said detection window, different from said first length,
obtain a second result indicating a second level of detected data events or timing events while using said second length of said detection window, and
select a value for at least one operating parameter based on at least one of said first and second levels of detected data events or timing events.

5. An adaptive microelectronic circuit according to claim 4, wherein said adaptive microelectronic circuit is configured to:
apply different thresholds of levels of detected da-ta events depending on whether said data events were detected using said first length or said second length of said detection window, so that said value selected for said at least one operating parameter depends on whether the level of detected data events was above or below the threshold applied.

6. An adaptive microelectronic circuit according to claim 1, comprising a plurality of signal-collecting circuits, wherein:
a first signal-collecting circuit among said plurality of signal-collecting circuits is configured to collect DE and/or TEO signals from a first group of monitor circuits within the microelectronic circuit and to deliver the collected DE and/or TEO signals or indications thereof to said control unit,
a second signal-collecting circuit among said plurality of signal-collecting circuits is configured to collect DE and/or TEO signals from a second group of monitor circuits within the microelectronic circuit, different from said first group, and to deliver the collected DE and/or TEO signals or indications thereof to said control unit, and
said control unit is configured to perform said lowering of said operating voltage value based on what it received from said plurality of signal-collecting circuits.

7. An adaptive microelectronic circuit according to claim 1, comprising a non-delay-critical portion of the microelectronic circuit that comprises at least one of said monitor circuits and that does not comprise delay-critical processing paths, wherein:
said control unit is configured to selectively lower said operating voltage value to a low value for the duration of a period when processing of digital data takes place only within said non-delay-critical portion, which low value is lower than a minimum operating voltage value needed to make digital values appear at data inputs of register circuits on delay-critical processing paths of the microelectronic circuit before respective allowable time limits.

8. An adaptive microelectronic circuit according to claim 7, wherein:
said non-delay-critical portion comprises a wake-up control circuit that comprises at least one of said monitor circuits,
said control unit is configured to selectively set the microelectronic circuit from an active mode into a sleep mode in which parts of the microelectronic circuit other than said wake-up control circuit are inactive, and
said control unit is configured to set the microelectronic circuit from said sleep mode into said active mode in response to receiving a DE signal from said at least one of said monitor circuits comprised in said wake-up control circuit.

* * * * *

UNITED STATES PATENT AND TRADEMARK OFFICE
CERTIFICATE OF CORRECTION

| | | |
|---|---|---|
| PATENT NO. | : 11,894,848 B2 | Page 1 of 1 |
| APPLICATION NO. | : 17/311186 | |
| DATED | : February 6, 2024 | |
| INVENTOR(S) | : Navneet Gupta et al. | |

It is certified that error appears in the above-identified patent and that said Letters Patent is hereby corrected as shown below:

In the Claims

In Column 18, Line 4, Claim 5, delete "da-ta" and insert -- data --, therefor.

Signed and Sealed this
Thirtieth Day of April, 2024

Katherine Kelly Vidal
*Director of the United States Patent and Trademark Office*